(12) United States Patent
Okada et al.

(10) Patent No.: US 7,303,781 B2
(45) Date of Patent: Dec. 4, 2007

(54) THIN FILM FORMATION METHOD BY INK JET METHOD, INK JET APPARATUS, PRODUCTION METHOD OF ORGANIC EL DEVICE, AND ORGANIC EL DEVICE

(75) Inventors: Nobuko Okada, Suwa (JP); Shunichi Seki, Suwa (JP); Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 639 days.

(21) Appl. No.: 10/617,747

(22) Filed: Jul. 14, 2003

(65) Prior Publication Data

US 2004/0191408 A1    Sep. 30, 2004

Related U.S. Application Data

(62) Division of application No. 09/820,650, filed on Mar. 30, 2001, now Pat. No. 6,623,097.

(30) Foreign Application Priority Data

Mar. 31, 2000  (JP) .............................. 2000-098161
Dec. 11, 2000  (JP) .............................. 2000-376294

(51) Int. Cl.
   *B05D 5/12*   (2006.01)
(52) U.S. Cl. .................... 427/66; 427/66; 427/256; 427/258; 427/421.1
(58) Field of Classification Search ................. 118/300
   See application file for complete search history.

(56) References Cited

U.S. PATENT DOCUMENTS

| | | | |
|---|---|---|---|
| 4,340,893 A | 7/1982 | Ort | 347/102 |
| 5,225,855 A | 7/1993 | Hansen et al. | 436/155 |
| 5,951,350 A * | 9/1999 | Aoki et al. | 445/24 |
| 6,030,700 A * | 2/2000 | Forrest et al. | 428/336 |
| 6,107,452 A * | 8/2000 | Miller et al. | 528/422 |
| 6,194,119 B1 * | 2/2001 | Wolk et al. | 430/200 |
| 6,390,618 B1 * | 5/2002 | Wotton et al. | 347/102 |

(Continued)

FOREIGN PATENT DOCUMENTS

| | | |
|---|---|---|
| JP | 7-235378 | 9/1995 |
| JP | 10-12377 | 1/1998 |
| JP | 10-153967 | 6/1998 |
| JP | 11-40358 | 2/1999 |
| JP | 11-54270 | 2/1999 |

(Continued)

OTHER PUBLICATIONS

C.W. Tang et al., *Organic electroluminescent diodes*, American Institute of Physics, Appl. Phys. Lett. 51 (12), Sep. 21, 1987.

(Continued)

*Primary Examiner*—Timothy Meeks
*Assistant Examiner*—Jimmy Lin
(74) *Attorney, Agent, or Firm*—Oliff & Berridge, PLC

(57) ABSTRACT

A method of forming a thin film by an ink jet method including the step of discharging a liquid containing thin film-forming materials and a solvent from liquid discharge ports to each position on a substrate while the liquid discharge ports are being moved relatively to the substrate, characterized in that subsequent droplets are arranged while a solvent vapor evaporating from droplets arranged previously on the substrate are compulsively removed from inside the substrate surface.

15 Claims, 9 Drawing Sheets

U.S. PATENT DOCUMENTS

| | | | |
|---|---|---|---|
| 6,575,800 B1 * | 6/2003 | Kobayashi et al. | 445/24 |
| 6,830,494 B1 * | 12/2004 | Yamazaki et al. | 445/24 |
| 6,863,961 B2 * | 3/2005 | Miyashita et al. | 428/203 |
| 2001/0016260 A1 * | 8/2001 | Yoshida et al. | 428/425.8 |
| 2002/0009536 A1 * | 1/2002 | Iguchi et al. | 427/10 |

FOREIGN PATENT DOCUMENTS

| | | |
|---|---|---|
| JP | 11-54272 | 2/1999 |
| JP | 11-339957 | 12/1999 |
| JP | 2000-106278 | 4/2000 |
| JP | 2000-123975 | 4/2000 |
| WO | WO 9824271 A1 * | 6/1998 |
| WO | WO 9827570 A1 * | 6/1998 |
| WO | WO 99/12396 * | 3/1999 |
| WO | WO 01/70506 * | 9/2001 |

OTHER PUBLICATIONS

J.C. Carter et al., *Operating stability of light-emitting polymer diodes based on poly (p-phenylene vinylene)*, American Institute of Physics, Appl. Phys. Lett. 71 (1), Jul. 7, 1997.

* cited by examiner (a)

(b)

THIN FILM FORMATION METHOD BY INK JET METHOD, INK JET APPARATUS, PRODUCTION METHOD OF ORGANIC EL DEVICE, AND ORGANIC EL DEVICE

This is a Divisional of application Ser. No. 09/820,650 filed Mar. 30, 2001 now U.S. Pat. No. 6,623,097. The entire disclosure of the prior application is hereby incorporated by reference herein in its entirety.

BACKGROUND OF THE INVENTION

1. Field of Invention

This invention relates to a thin film formation method by an ink jet method, an ink jet apparatus, a production method of an organic EL (electro-luminescence) device, and an organic EL device.

2. Description of Related Art

An organic EL display including organic EL devices (light emitting device having a light emitting layer made of an organic material interposed between an anode and a cathode) so arranged as to correspond to pixels has been rapidly developed in recent years as a spontaneous light emitting display that will replace current liquid crystal displays. Materials of the light emitting layer of the organic EL device can include aluminum quinolynol complexes (Alq3) and poly(paraphenylene)vinylene (PPV) as an organic material having a high molecular weight.

As disclosed in "Appl. Phys. Lett." 51(12), 21 Sep., 1987, 913, it is known to form a film of a light emitting layer made of an organic material having a low molecular weight by vacuum evaporation. Another reference, "Appl. Phys. Lett." 71(1), 7 Jul., 1997, p.34 et seq. describes the film formation of a light emitting layer made of an organic material having a high molecular weight.

In organic EL devices for display, it is necessary to form an anode at each pixel position on a substrate and to dispose a light emitting layer on each anode. If the arrangement of the light emitting layer can be performed by an ink jet method, precise patterning can be made within a short time because application and patterning can be conducted simultaneously. Moreover, since the amount of materials to be used is that which is minimum necessary, the materials can be used without waste and the production cost can be lowered.

To arrange the light emitting layer by an ink jet method, it is necessary to use a material in the liquid form. When a polymer material such as PPV is used as the material of the light emitting layer, the arrangement can be made by the ink jet method if a precursor solution of the polymer material is used. Japanese Patent Laid-Open Publication Nos. 11-40358, 11-54270 and 11-339957 teach to arrange a light emitting layer made of a PPV type polymer material in accordance with the ink jet method.

As shown in FIG. 1A, in the liquid arrangement by the conventional ink jet method, an ink jet head 2 smaller than a substrate 1, for example, is employed. The inside of the surface of the substrate 1 is so divided into a plurality of regions 11 to 15 as to correspond to the length of rows of nozzles 3 of the head 2. The liquid is serially discharged from the nozzles 3 of the head 2 while the substrate 1 or the head 2 is being moved.

According to this method, however, when a solvent of the liquid to be discharged is a solvent having a large density, a solvent vapor evaporating from droplets is likely to stay inside the substrate surface. When a droplet A having an early arrangement order on the substrate is compared with a droplet B having a late arrangement order, for example, as shown in FIG. 1B, the droplet B having a late arrangement order is discharged in an atmosphere in which the partial pressure of the solvent vapor is high. As a result, a drying rate of the droplet B is lower than that of the droplet A. The droplet A arranged previously, too, is affected by the solvent vapor staying inside the substrate surface and in some cases, it is again dissolved after drying or its drying rate becomes lower.

Therefore, when a solution prepared by dissolving a plurality of polymer materials having mutually different molecular weight or polarity in a solvent having a large density is arranged on the substrate by the conventional ink jet method, the droplets having a low drying rate are likely to result in a thin film in which a plurality of polymer materials are in the phase separation state. When the drying rates of the droplets are different inside the substrate surface, the condition of the resultant thin film becomes different depending on the position inside the substrate surface.

As described above, when the conventional ink jet method is employed to arrange the light emitting layer in the organic EL display, luminance is likely to vary inside and among pixels.

SUMMARY OF THE INVENTION

In view of the problems with the conventional technologies, the present invention is directed to obtain a thin film having high uniformity inside a substrate surface even when a solvent of a liquid to be discharged has a large density in a formation method of a thin film by an ink jet method.

In a method of forming a thin film by an ink jet method including the step of discharging a liquid containing thin film-forming materials and a solvent from liquid discharge ports to each position on a substrate while the liquid discharge ports are being moved relatively to the substrate, the present invention provides a thin film formation method by an ink jet method characterized in that subsequent droplets are arranged while a solvent vapor evaporating from droplets arranged previously on the substrate is compulsively removed from inside the substrate surface.

In a method of forming a thin film by an ink jet method including the step of discharging a liquid containing thin film-forming materials and a solvent from liquid discharge ports to each position on a substrate while the liquid discharge ports are being moved relatively to the substrate, the present invention provides a thin film formation method by an ink jet method characterized in that a solvent vapor evaporating from droplets arranged previously on the substrate is compulsively removed from inside the substrate surface immediately after the arrangement of the droplets.

The present invention further provides an ink jet apparatus including gas blowing means for blowing a gas to a surface of a liquid discharged surface on which droplets have already been arranged.

The present invention provides a thin film formation method by an ink jet method including the steps of moving relatively liquid discharge ports with respect to a substrate, discharging a liquid containing thin film-forming materials and a solvent to each position of the substrate from the liquid discharge ports and arranging successively droplets at positions on the substrate. The present invention further has a feature in that a solvent vapor evaporating from the droplets arranged previously is compulsively removed from inside the substrate and subsequent droplets are arranged.

Accordingly, even when the solvent of the liquid to be discharged has a large density, the method described above prevents the solvent vapor evaporating from the droplets arranged previously on the substrate from staying inside the substrate surface. Consequently, the liquid at positions of a late arrangement order can be discharged at a low partial vapor pressure of the solvent. A solvent having a large density is, for example, cyclohexylbenzene, tetralin, tetramethylbenzene, dodecylbenzene or diethylbenzene.

In this way, it becomes possible to prevent a drying rate of the droplets at the positions of the late arrangement order from becoming lower than that of the droplets at positions of the early arrangement order. It also becomes possible to prevent the droplets at positions of the early arrangement order from being re-melt after drying, and to prevent the drying rate of such droplets from being retarded. Since the delay of the drying rate of the droplets can thus be prevented, formation of a thin film, in which a plurality of polymer materials having different molecular weight and different polarity exist in a phase separation state, can be prevented even when a solution in which such polymer materials are dissolved in a solvent having a great density is used as a discharging liquid.

In a thin film formation method by an ink jet method including the steps of discharging a solution containing the thin film-forming materials and the solvent from liquid discharge ports to each position of a substrate while the liquid discharge ports are being moved relatively to the substrate, and thus arranging serially a droplet at each position of the substrate, the present invention has another feature in that a solvent vapor evaporating from the droplets arranged on the substrate are compulsively removed from inside the substrate surface immediately after the arrangement of the droplets.

According to this method, the solvent vapor evaporating from the droplet arranged on the substrate rapidly becomes absent inside the substrate surface. Therefore, the droplet previously arranged is prevented from being affected by the solvent vapor evaporating from the droplet arranged subsequently. Thus, the difference of the drying condition can be reduced between the droplet arranged previously and the droplet arranged subsequently.

In an embodiment of the present invention, the solvent vapor is preferably removed by blowing a gas to the substrate surface. This method can effectively remove the solvent vapor even when the solvent of the liquid to be discharged is a solvent that has a large density and is likely to stay inside the substrate surface. The gas used for this method must be the one that does not react with the liquid to be discharged. Preferably, an inert gas, such as an argon gas or a nitrogen gas, is used.

In the embodiment of the method of the present invention described above, the gas is preferably blown always to the substrate surface on the rear side of the liquid discharge ports (on the rear side of the relative traveling direction of the liquid discharge port to the substrate) while the droplet is arranged at any position on the substrate.

When the substrate surface is divided into a plurality of belt-like regions in a certain direction, for example, and when the droplets are arranged while the liquid discharge ports are being moved relatively in the same direction in each of the regions, the method described above can compulsively remove the solvent vapor from the droplets of the regions, where the arrangement of the droplets are now being arranged, and can prevent the solvent vapor from flowing to the regions where the droplets are to be arranged subsequently and to the regions where the droplets have already been arranged. As a result, the drying condition of the droplet at each position inside the substrate surface can be rendered uniform.

The present invention further provides an ink jet apparatus including gas blowing means for blowing a gas to a surface of a liquid discharged surface on which droplets have already been arranged. This ink jet apparatus can easily perform the methods of the present invention.

In an ink jet apparatus according to one embodiment of the present invention, a gas blowing device has a tubular gas blowing part having a plurality of gas blowing holes formed in a longitudinal direction. It is preferable that this tube be fixed to an ink jet head having a liquid discharge port and its fixing position is on the rear side in the relative traveling direction to the surface of the ink jet to which the liquid is to be discharged.

In an embodiment of the ink jet apparatus according to the present invention, a gas blowing part is disposed in the proximity of the liquid discharge port, and is preferably constructed in such a fashion as to blow the gas at an angle of 30° to 60° to a perpendicular direction on the rear side of a relative traveling direction of the ink jet head to the surface of the liquid jet surface.

In one embodiment of the ink jet apparatus according to the present invention, the length of the gas blowing region in the longitudinal direction of the tube is preferably at least twice the size of the liquid jet surface in the longitudinal direction of the tube, and an ink jet head is preferably disposed at the center of the gas blowing region of the tube in its longitudinal direction.

In one embodiment of the ink jet apparatus according to the present invention, the tube is fixed also on the front side in the relative traveling direction of the ink jet head to the liquid discharged surface.

The present invention further provides a production method of an organic EL device for forming a thin film constituting an organic EL device by using the thin film formation method of the ink jet method according to the present invention, or by using the ink jet apparatus according to the present invention, and an organic EL device produced by this method.

BRIEF DESCRIPTION OF THE DRAWINGS

The invention is described in detail with reference to the following figures, wherein like numerals reference like elements, and wherein.

DETAILED DESCRIPTION OF PREFERRED EMBODIMENTS

Figure 1:
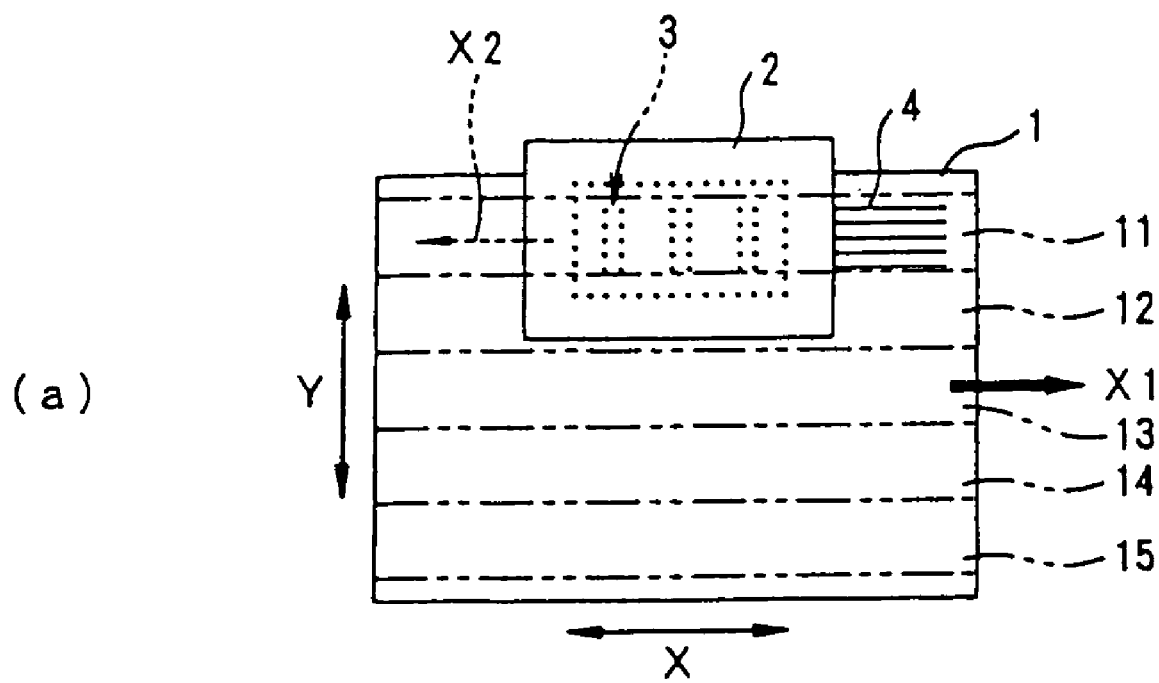
FIG. 1 is a plan view 1A for explaining liquid arrangement methods by an ink jet method corresponding to a first embodiment of the present invention and to a conventional method, and a plan view 1B for explaining a difference of conditions of thin films depending on positions of droplets.
Figure 1:
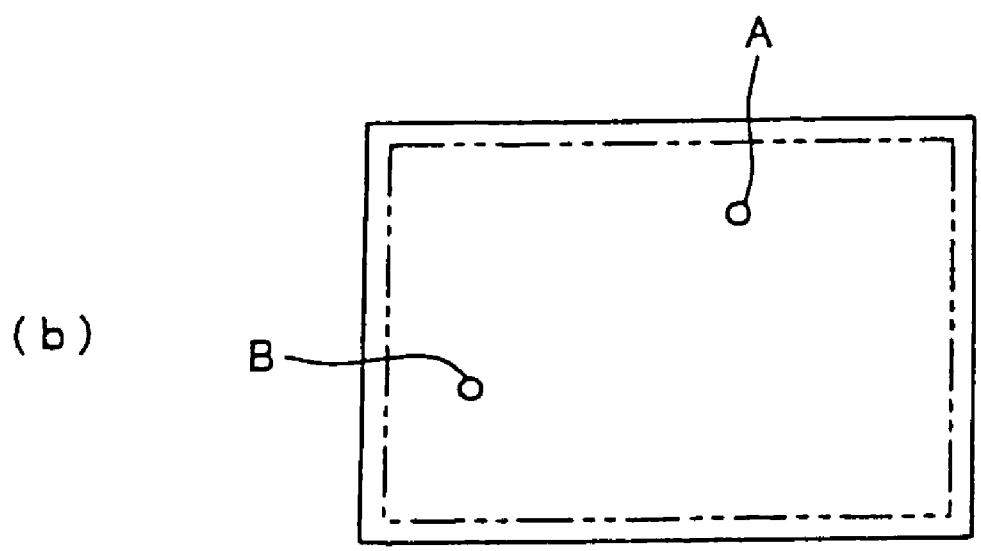

A thin film formation method by an ink jet method corresponding to the first embodiment of the present invention will be explained. As shown in FIG. 1A, this method uses an ink jet head 2 that is smaller than a substrate 1. The head 2 is disposed over a surface of the substrate 1. A liquid is discharged from rows of nozzles 3 (liquid discharge ports) arranged at lower part of the head 2. The surface of the rectangular substrate 1 is divided into a plurality of belt-like regions 11 to 15 in a direction X of a major side of a rectangle in such a manner as to correspond to the length of the rows of nozzles 3 of the head 2.

While the substrate 1 is being moved to the right (the direction indicated by arrow X1) in the major side direction X, the liquid is discharged from the rows of the nozzles 3 of the head 2 for each region 11 to 15 from the right end to the left end of the substrate 1 so that droplet of a liquid 4 can be arranged at each position of the substrate 1. The head 2 moves to the left (the direction indicated by arrow XZ) relative to the substrate 1.

After the arrangement of the droplet in one region is thus finished, nitrogen is blown at a rate of 0.1 MPa to the surface of the substrate 1 in this region so that the solvent vapor evaporating from the droplets 4 arranged on the substrate 1 can be compulsively removed from inside the surface of the substrate 1. Subsequently, the head 2 is moved in the minor side direction Y of the rectangle forming the substrate 1 and the substrate 1 is moved to the left X2, thereby positioning the head 2 to the right end (jet starting position) of the next region. When this operation is repeated, the arrangement of the droplets 4 and the removal of the solvent vapor can be conducted from the region 11 to the region 15.

In the method of this embodiment, while the solvent vapor evaporating from the droplets arranged previously on the substrate 1 are compulsively removed from inside the substrate surface, subsequent droplets are arranged in the unit of each region 11 to 15.

The liquid used in this embodiment can be prepared by dissolving 10 g/liter of a mixture of the compounds 1, 2 and 3 expressed by the following chemical formulas (1) to (3) in a weight ratio of 0.76:0.2:0.04 in a cyclohexylbenzene. This mixture is a material for forming a green light emitting layer of the organic EL device.

According to the method of this embodiment, the arrangement of the droplets 4 in each region is conducted after the solvent vapor in a preceding region is removed. Therefore, as shown in FIG. 1B, the droplet B having a late arrangement order can be arranged onto the substrate in an atmosphere having a low partial pressure of the solvent vapor in the same way as the droplet A having an early arrangement order. Therefore, either droplets A and B have a high drying rate, and phase separation does not occur in the resultant thin film obtained by conducting heat-treatment after drying.

Figure 2:
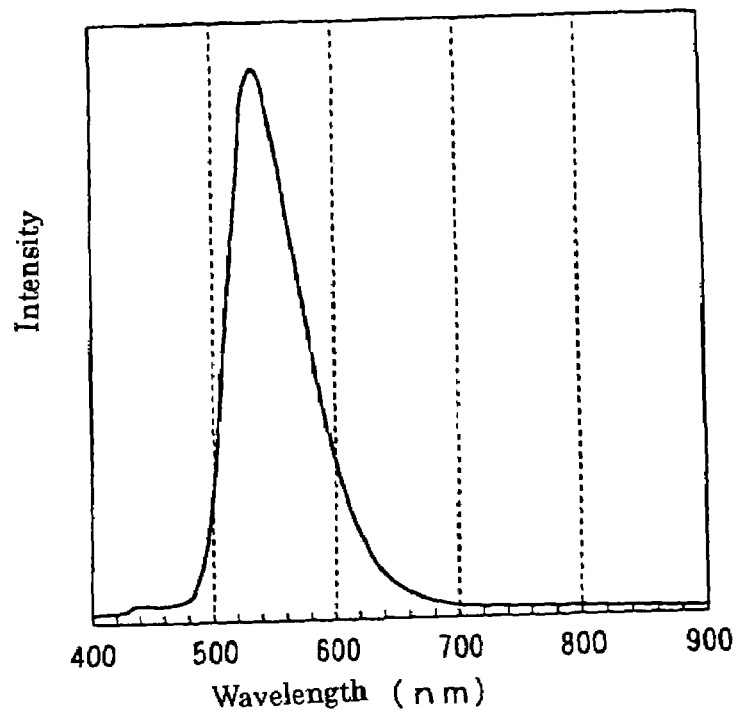
FIG. 2 is a graph showing a fluorescent spectrum of a thin film formed by arranging droplets by the method of the first embodiment, at both positions corresponding to droplets A and B in FIG. 1B.

An example of the present invention is now described with reference to FIG. 2. Droplets were arranged in accordance with the method of the first embodiment, and a thin film was formed. Next, a fluorescent spectrum was measured for the thin film at each position corresponding to each of the droplets A and B in FIG. 1B. As a result, the same fluorescent spectrum shown in FIG. 2 could be obtained at the positions of both droplets A and B. In the graph shown in FIG. 2, only one large peak having a center wavelength at 515 nm appeared. It could be understood that either droplets A and B were dried under the state where phase separation did not occur.

As a comparative example, the compulsive removal of the solvent vapor by blowing nitrogen was not conducted after the arrangement of the droplet in each region and the droplets 4 were consecutively arranged from the region 11 to the region 15 with the other procedures being the same as those of the first embodiment. When the fluorescent spectrum was measured for the resultant thin film at each position corresponding to each of the droplets A and B in FIG. 1B, the spectrum shown in FIG. 3 could be obtained at the position of the droplet A, and the fluorescent spectrum shown in FIG. 4, at the position of the droplet B.

Figure 3:
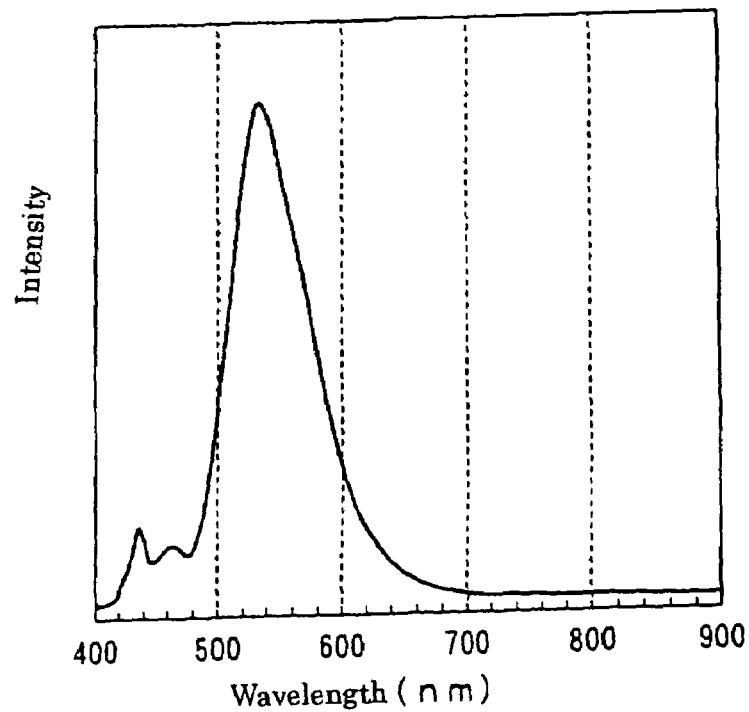
FIG. 3 is a graph showing a fluorescent spectrum of a thin film formed by arranging droplets by the conventional method, at a position corresponding to the droplet A in FIG. 1B.
Figure 4:
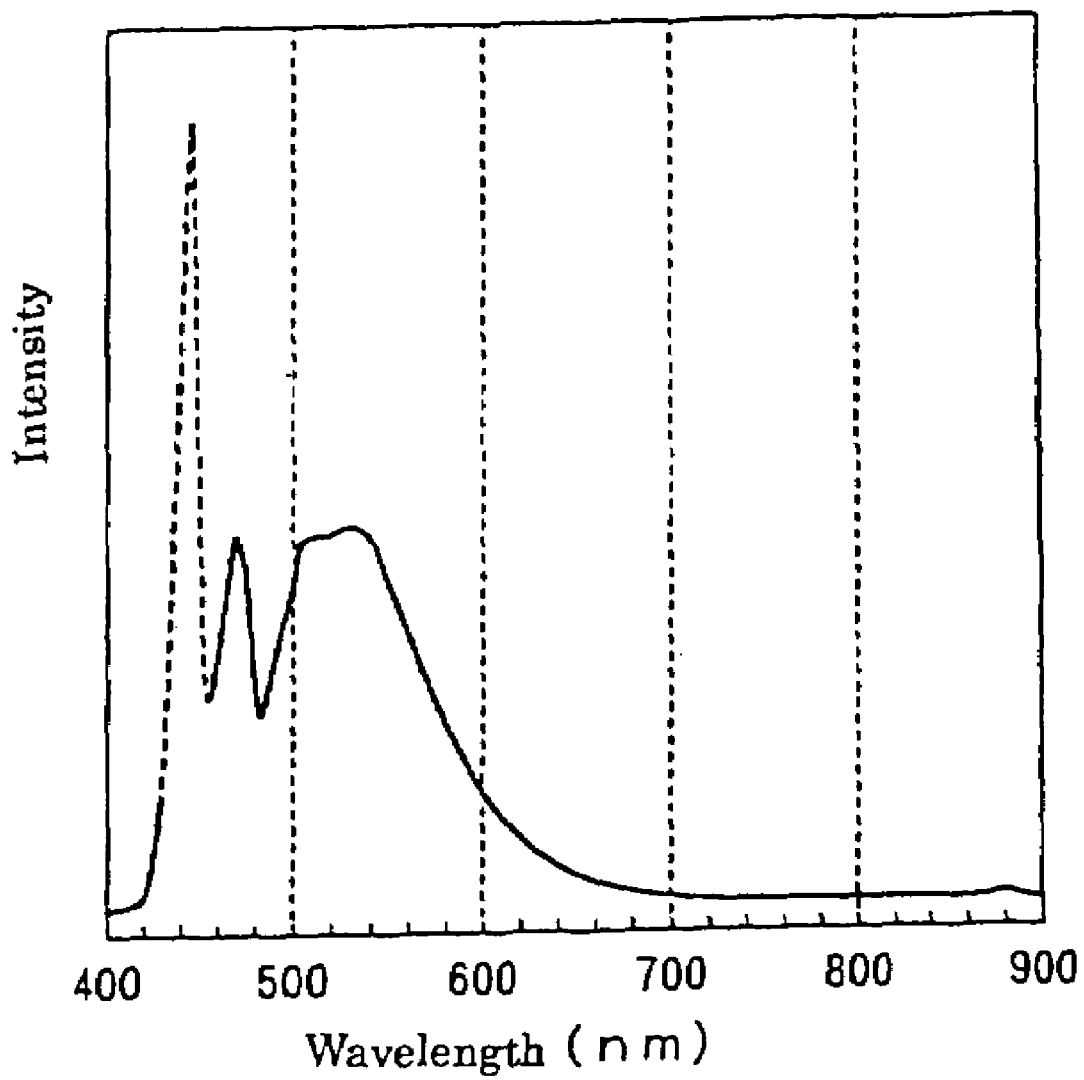
FIG. 4 is a graph showing a fluorescent spectrum of a thin film formed by arranging droplets by the conventional method, at a position corresponding to the droplet B in FIG. 1B.

As shown, in the graph shown in FIG. 3, small peaks appeared at 420 nm and 475 nm besides the peak of the center wavelength at 515 nm. It could thus be understood that the droplet A was dried under the state where phase separation occurred. In the graph shown in FIG. 4, the peak intensity at the center wavelength of 515 nm was low, the peak intensity at 475 nm was approximate to the former, and a peak having a high intensity appeared at 420 nm. This result indicated that the droplet B was dried under the state where phase separation occurred.

Accordingly, it can be understood from the description given above that the method of this embodiment can obtain a thin film free from the occurrence of phase separation at the position having an early arrangement order and at the position having a late arrangement order.

Figure 5:
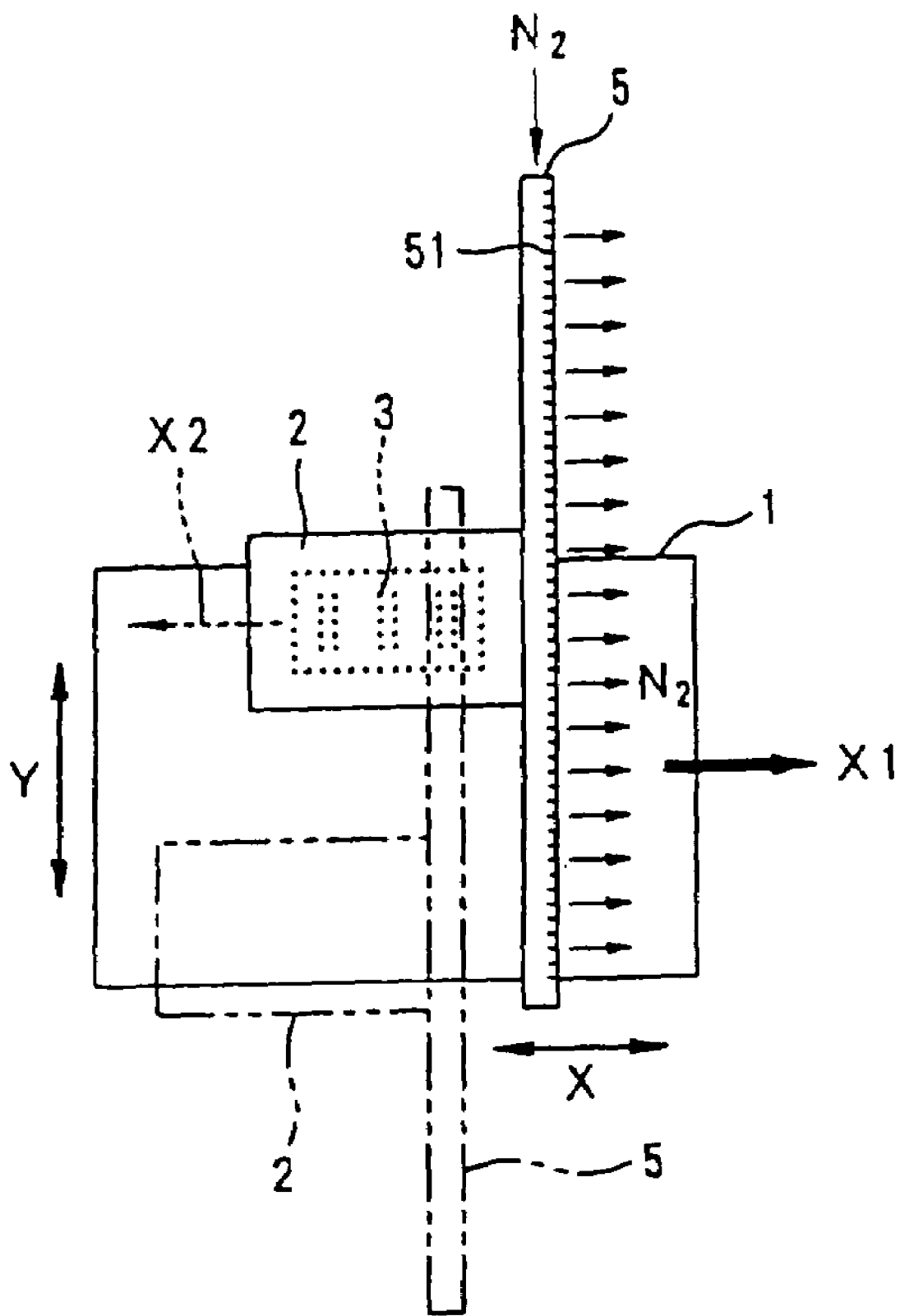
FIG. 5 is a plan view for explaining a method according to a second embodiment.
Figure 6:
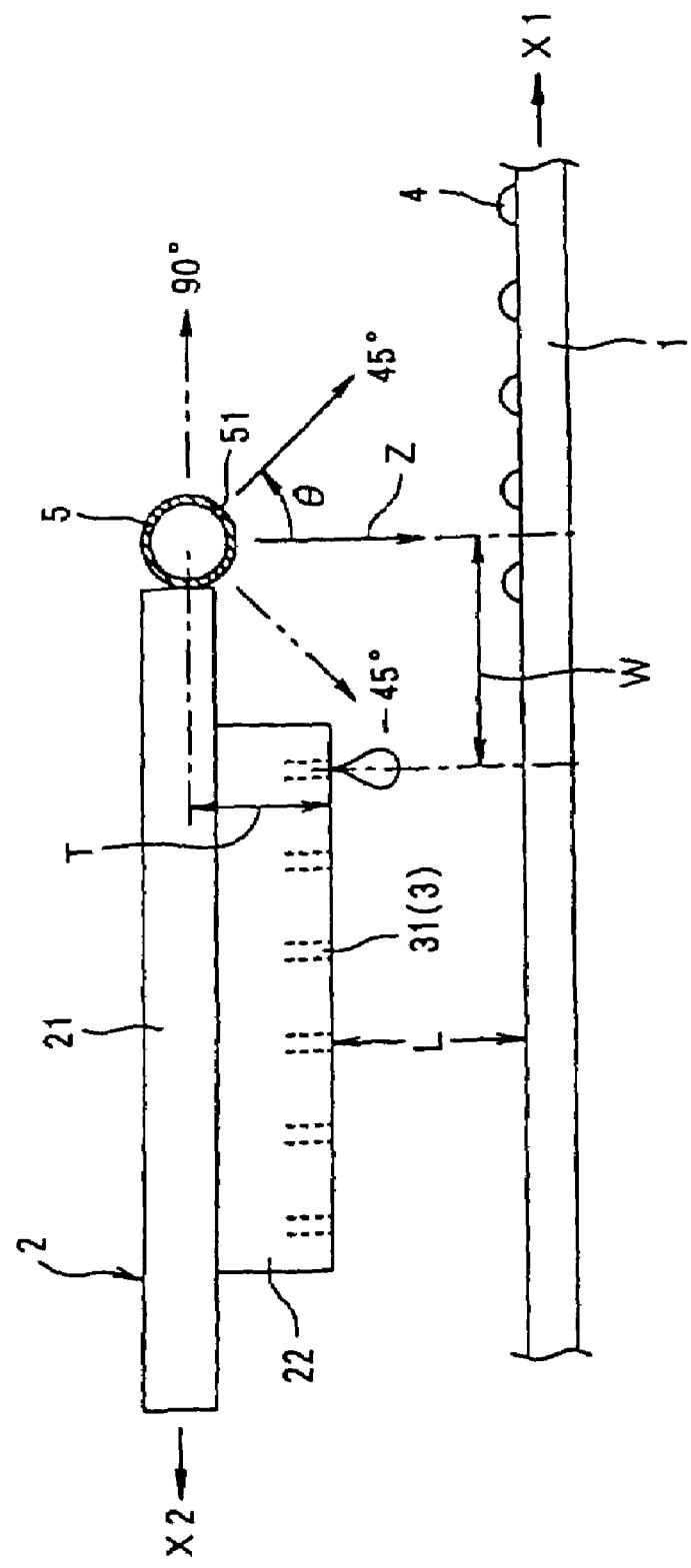
FIG. 6 is a side view for explaining an ink jet apparatus for use in the method according to the second embodiment.

A thin film formation method by the ink jet method corresponding to the second embodiment of the present invention will be explained. FIG. 5 is a plan view for explaining the method of this embodiment. FIG. 6 is a side view for explaining an ink jet apparatus for use in the method of this embodiment. This method uses an ink jet head 2 that is smaller than a substrate 1 in the same way as in the first embodiment. The head 2 is disposed over the surface of the substrate 1, and a liquid is discharged from rows of a nozzles 3 (liquid discharge ports) disposed at a lower part of the head 2. The surface of the substrate 1 is divided into a plurality of regions in such a manner as to correspond to the length of the nozzle rows 3 of the head 2 in the same way as in the first embodiment. A liquid is discharged serially from the nozzle rows 3 in each region while the substrate 1 is being moved in the same way as in the first embodiment.

However, unlike the first embodiment, this method uses an ink jet apparatus having a gas flow tube 5 fixed to the ink jet head 2, and discharges the liquid while a gas is always blown out from this tube 5.

As shown in FIG. 6, the ink jet head 2 comprises an upper member 21 and a lower member 22. The lower member 22 has a planar shape smaller than that of the upper member 21, and incorporates therein a nozzle 31, and the like. The gas blow tube 5 is fixed to the rear end surface of the upper member 21. The rear end surface of the upper member 21 corresponds to the rear side of the relative traveling direction X2 of the ink jet head 2.

A large number of gas blowout holes 51 are uniformly formed at equal distances and arranged into line on the peripheral surface of the tube 5 throughout its longitudinal direction in the longitudinal direction of the tube 5. One of the ends of the tube 5 is closed with the other being connected to a nitrogen gas feed pipe. The tube (gas blowing part) 5, the nitrogen gas feed pipe, etc, together constitute a gas blowing apparatus for blowing the gas to the upper surface (liquid discharged surface) of the substrate 1.

The length of the tube 5 (the length of the gas blowing region) can be twice the size of the substrate 1 in the minor side direction Y. The head 2 is disposed at the center of the tube 5 in its longitudinal direction. The tube 5 is fixed to the head 2 in such a fashion that the longitudinal direction of the tube 5 is parallel to the nozzle rows 3 and the angle θ (with the X1 side being positive) of the gas blowout holes 51 to the perpendicular direction Z is 45°.

Therefore, this ink jet apparatus can blow out the gas from the tube 5 to the entire part of the substrate 1 in the minor axis direction Y at whichever position of the substrate 1 the head 2 may be positioned.

In the method of this embodiment, the solvent vapor evaporating from the droplets 4 arranged on the substrate 1 are blown away by the gas blown out from the tube 5 immediately after the droplets 4 are arranged, and are removed towards the traveling direction X1 of the substrate 1. The gas is always blown from the tube 5 to the surface of the substrate 1 in the regions other than the region in which the droplets are being arranged. Consequently, the solvent vapor blown away by the gas does not flow towards the regions in which the droplets are to subsequently be arranged and in the regions in which they have already been arranged.

According to the method of this embodiment, therefore, the previously arranged droplets are prevented from being affected by the solvent vapor evaporating from the subsequently arranged droplets, so that the previously arranged droplets and the subsequently arranged droplets are dried under the same condition.

In another example, hereinafter referred to as Example Z-1, a thin film was formed by arranging droplets 4 in the whole region on a substrate 1 in accordance with the method of the second embodiment by using the same liquid as that of the first embodiment. The example was conducted with the following arrangement conditions:

distance L between lower surface of head 2 and substrate 1: 0.6 mm distance W between tube 5 and center of nozzle 31 nearest to tube 5: 10 mm difference T of height between center of sectional circle of tube 5 and lower surface of head 2: 10 mm diameter (inner diameter) of tube 5: 2 mm diameter of gas blowout hole 51: 1 mm distance between centers of adjacent gas blowout holes 51: 2 mm blowout pressure of nitrogen: 0.1 MPa As a result, phase separation did not occur in the resultant film in the whole region of the substrate 1.

In another example, the angle θ of the gas blowout holes 51 to the perpendicular direction Z was changed to −45°, 0°, 30°, 45° and 60°. An argon gas was used in place of the nitrogen gas and the blowout pressure of the argon gas was set to 0.175 MPa. With the exceptions of these points, the droplets 4 were arranged in the whole region on the substrate 1 to form a thin film in the same way as in example 1.

As a result, phase separation did not occur in the resultant thin film in the whole region of the substrate 1 when the angle θ was θ=30°, θ=45° and θ=60°. Clogging of the nozzles 31 did not occur, either. When θ=−45°, clogging of the nozzles 31 occurred during discharging of the liquid. This was presumably because the argon gas was blown to the lower surface of the head 2 and the liquid inside the nozzles 31 was dried. As the argon gas was blown, the liquid discharged from the nozzles 31 fell to obliquely forward positions but not in the perpendicular direction.

When θ=0°, clogging of the nozzles 31 did not occur. As to the condition of the resultant thin film, phase separation did not occur at the position of the droplet A in FIG. 1B but did occur at the position of the droplet B.

When θ=90°, clogging of the nozzles 31 did not occur. As to the condition of the resultant thin film, phase separation did not occur at the position of the droplet A in FIG. 1B but did occur at the position of the droplet B. The degree of this phase separation was substantially equal to the degree when the droplets 4 were arranged without blowing the gas.

It could be understood from the result of this example that the ink jet apparatus for use in the method of the present invention most preferably had the construction in which, when the gas flow tube (gas blowing part) 5 was disposed in the proximity of the nozzle (liquid discharge ports) 31, the tube 5 was disposed on the rear side of the relative traveling direction X2 of the ink jet head 2 to the substrate (liquid discharged surface) 1 in such a fashion as to blow the gas at an angle of 30° to 60° to the perpendicular direction Z. This ink jet apparatus could provide an excellent solvent removing effect without affecting discharging of the liquid from the nozzles 31.

Figure 7:
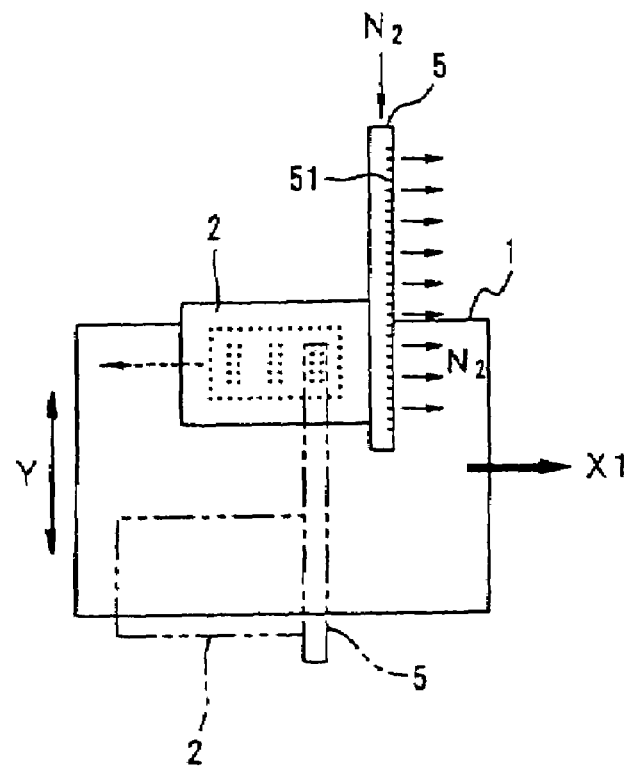
FIG. 7 is a plan view for explaining an ink jet apparatus for use in the method according to the second embodiment.

In another example, and as shown in FIG. 7, the length of the tube 5 (the length of the gas blowing region) was set substantially equal to the size of the substrate 1 in the minor side direction Y. The head 2 was disposed on the closed end side of the tube 5. Therefore, when the head 2 was positioned in the last region of the substrate 1 (represented by two-dot-chain lines), the gas was blown out from the tube 5 substantially to the whole part of the substrate 1 in the minor side direction Y, and the regions in which the gas was not blown out from the tube 5 in the minor side direction Y of the substrate 1 existed at other times.

With the exception of the above-mentioned point, the droplets 4 were arranged in the whole region of the substrate 1 to form the thin film in the same way as in Example 1.

As to the condition of the resultant thin film, phase separation occurred locally in regions where the droplets had a late arrangement order. The degree of this phase separation and the amount of the thin film having such phase separation were extremely small in comparison with the case where the droplets were arranged without blowing the gas.

Figure 8:
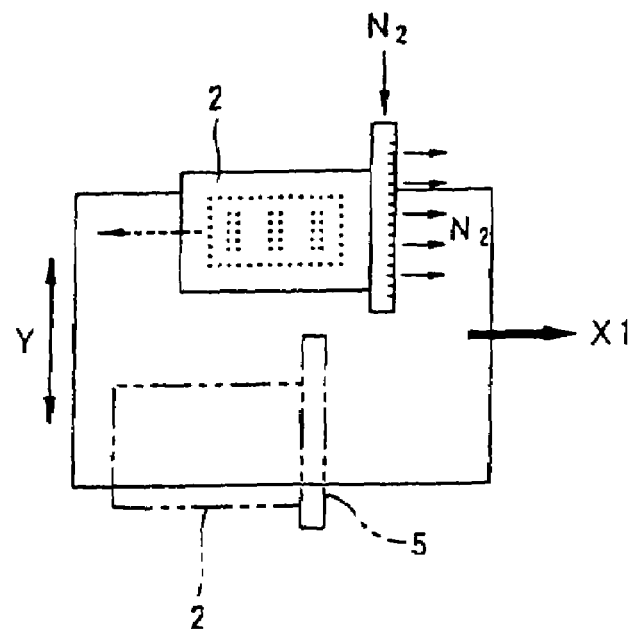
FIG. 8 is a plan view for explaining an ink jet apparatus for use in the method according to the second embodiment.

As shown in FIG. 8, there is another example where the length of the tube 5 (the length of the gas blowout region) was set to about a half of the size of the substrate 1 in the minor side direction Y. The head 2 was disposed at the center of the longitudinal direction of the tube 5. Therefore, the gas was blown to the region in which the droplets were being arranged at present, but the regions in which the gas was not blown from the tube 5 in the minor side direction Y of the substrate 1 always existed.

With the exception of the points described above, the droplets 4 were arranged in the whole region of the substrate 1 in the same way as in Example 1 to form the thin film.

As to the condition of the resultant thin film, phase separation locally occurred in the regions having a late arrangement order. The degree of this phase separation and the amount of the thin film having such phase separation were extremely small in comparison with the case where the droplets were arranged without blowing the gas, but were greater than those in the example of FIG. 7.

It could be understood from comparison of these examples that the ink jet apparatus for use in the method of the present invention had suitably a construction in which the length of the gas blowout region in the longitudinal direction of the tube 5 is at least twice the size of the substrate (liquid discharged surface) 1 in the minor side direction Y (the size in the longitudinal direction of the tube) and the ink jet head 2 was disposed at the center of the gas blowout region of the tube 5 in the longitudinal direction.

Figure 9:
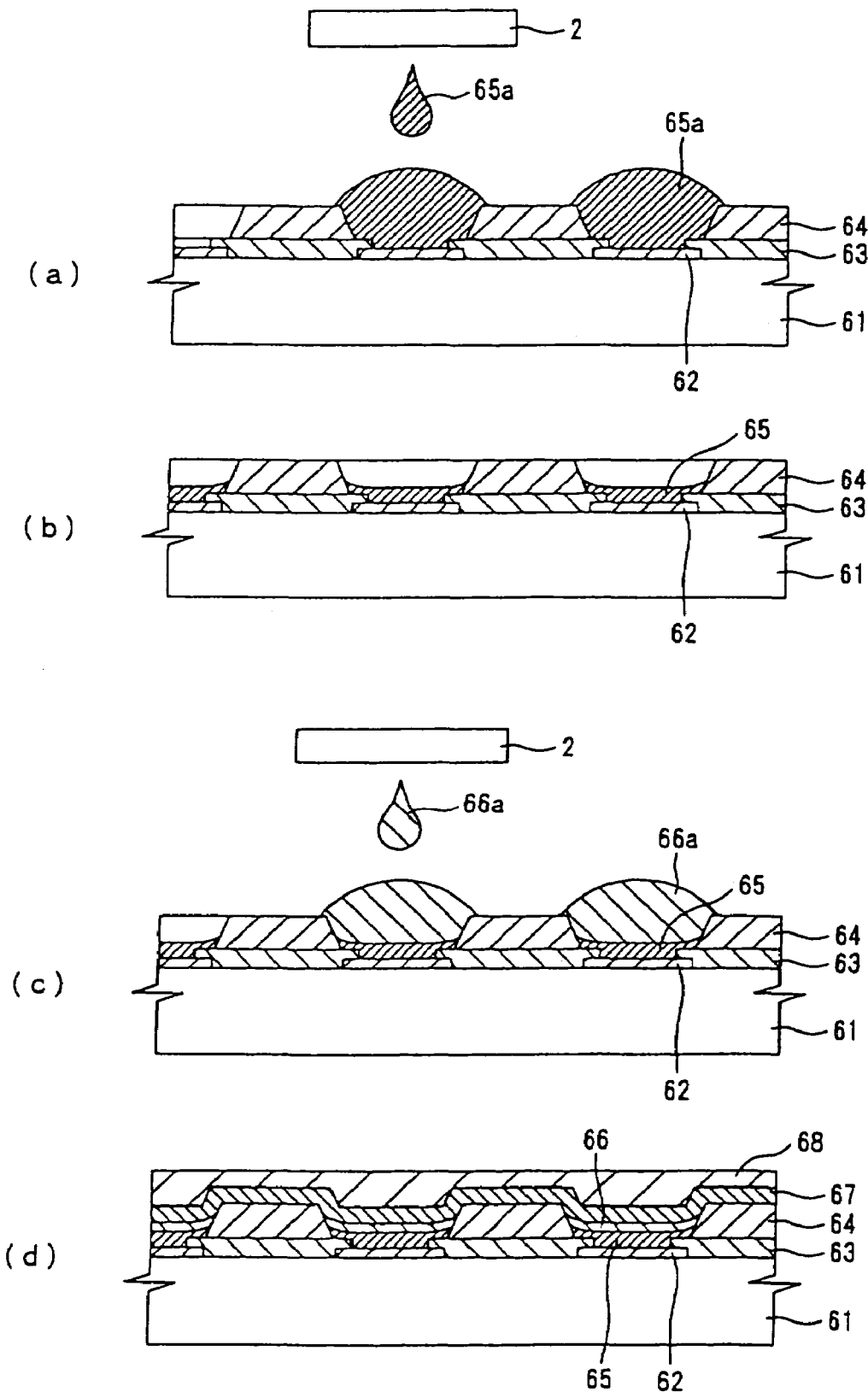
FIGS. 9A-9D are schematic views for explaining an example (third embodiment) where the thin film formation method according to the ink jet method of the present invention is applied to a production method of an organic EL device.

As the third embodiment, an example of the application of the thin film formation method by the ink jet method according to the present invention to a production method of an organic EL device will be explained with reference to FIG. 9. This organic EL device is an organic EL display in which pixels are disposed in a 70.5 μm pitch.

First, an ITO electrode (anode) 62 was formed at each pixel position on a glass substrate 61. Next, ordinary photolithographic and etching steps were conducted to form a barrier (bank) having a two-layered structure of a SiO2 layer 63 and a polyimide layer 64. A diameter of an open circle of the bank of the SiO2 layer 63 was 28 μm and its height was 2 μm. The diameter of the open circle at the uppermost part of the bank of the polyimide layer 64 was 32 μm.

Next, atmospheric plasma treatment was conducted to render the surface of the bank of the polyimide layer 64 liquid-repellent. This plasma treatment was conducted under the condition of an atmospheric pressure, power of 300 W and a distance between the electrode and the substrate of 1 mm. First, oxygen plasma treatment was conducted at an oxygen gas flow rate of 80 cmm, a helium gas flow rate of 10 SLM and a table conveying speed of 10 mm/sec. Next, CF4 plasma treatment was conducted at a CF4 gas flow rate of 100 ccm, a helium gas flow rate of 10 SLM and a table conveying speed of 5 mm/sec.

Next, a liquid 65a containing materials for forming a positive hole injection/transportation layer was disposed in the region (open part) encompassed by the bank having the two-layered structure. A mixed solution having the following composition was used as the liquid.

| | |
|---|---|
| Mixed solution of polyethylene dioxythiophene and polystyrenesulfonic acid: | 11.08 wt % |
| polyethylenesulfonic acid: | 1.44 wt % |
| isopropyl alcohol: | 10 wt % |
| N-methylpyrrolidone: | 27.48 wt % |
| 1,3-dimethyl-2-imidazolydinone: | 50 wt % |

The arrangement of the liquid by the ink jet method was conducted under the condition of Example 2-1 by the method of the second embodiment. However, the blowout pressure of nitrogen was changed to 0.175 MPa. The jet amount of the liquid to each open part was 15 p-liters. FIG. 9A shows this state.

Next, the glass substrate 61 under this condition was heated at room temperature to 200° C. for 10 minutes in an atmosphere at 1 Torr to form the positive hole injection/transportation layer 65 having a film thickness of 60 nm on the ITO electrode 62. FIG. 9B shows this state.

Next, a liquid 66a containing materials for forming a green color light emitting layer was disposed by the ink jet method over the positive hole injection/transportation layer 65. This liquid was the same as the liquid used in the first embodiment. The arrangement of this liquid was conducted by the method of the second embodiment under the condition of Example 2-1. However, the blowout pressure of nitrogen was changed to 0.175 MPa. FIG. 9C shows this state.

Subsequently, the liquid was naturally dried under this condition to form a 100 nm-thick green color light-emitting layer 66 on the ITO electrode 62. A cathode 67 was then formed. The cathode 67 could be prepared by vacuum depositing a 2 nm-thick LiF film and a 20 nm-thick Ca film and forming then a 200 nm-thick Al film by sputtering. A seal layer 68 made of an epoxy resin was formed on the cathode 67.

The organic EL display obtained by the method described above was driven at various voltages and luminance was measured at each position inside the surface of the glass substrate 61. As a result, substantially equal luminance could be obtained inside the substrate surface irrespective of the arrangement order of the droplets. Phase separation could not be observed in the green light color emitting layer 66 in all the pixels.

For comparison, an organic EL display device was produced in exactly the same way as described above with the exception that the liquid 65a for forming the positive hole injection/transportation layer and the liquid 65a for forming the green color emitting layer were arranged by using an ink jet apparatus not having the gas flow tube 5. This organic EL device was driven at various driving voltages and luminance was measured at each position inside the surface of the glass substrate 61. As a result, a difference of luminance was observed among the pixels due to the difference of the arrangement order of the droplets. Also, phase separation was observed in the green color light emitting layer 66 of several pixels.

Figure 10:
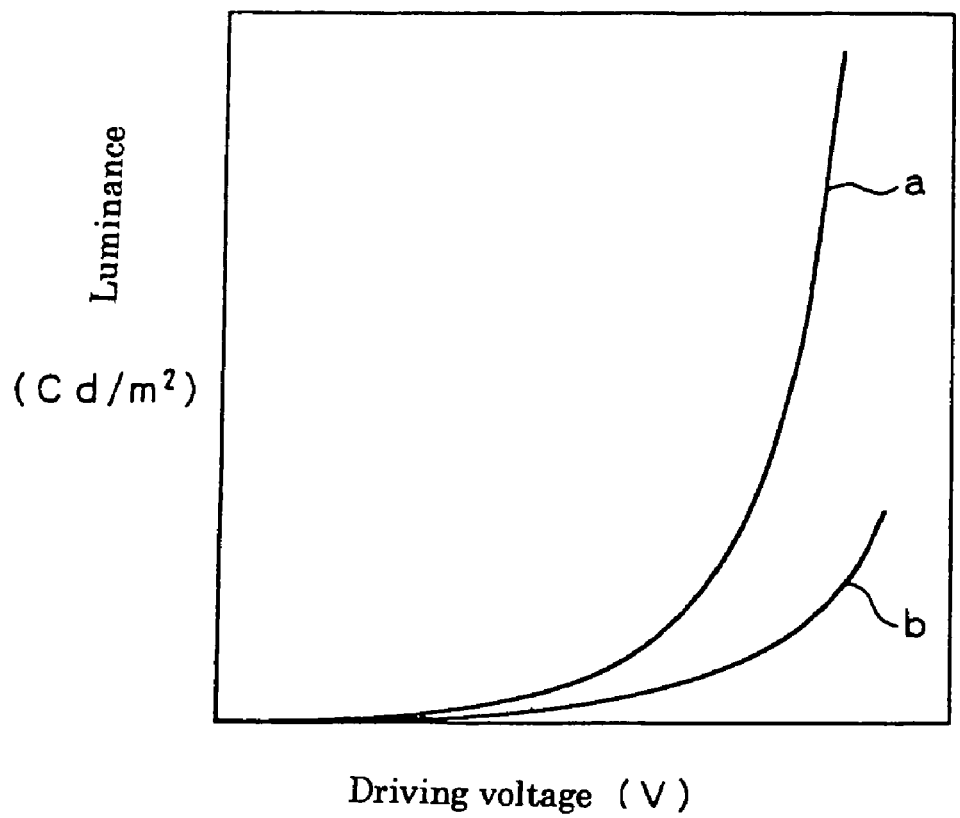
FIG. 10 is a graph showing an examination result between a driving voltage and luminance of an organic EL device, wherein curve a represents the result obtained by the method of the third embodiment and curve b represents the result by a method of a comparative example.

FIG. 10 is a graph showing the examination result of the relation between the driving voltage and luminance of these organic EL displays. The curve labeled "a" in this graph represents the result of the organic EL display obtained by the method of the third embodiment and curve b represents the result of the organic EL display obtained by the method of comparative example. Incidentally, luminance represented by both curves was measured for the pixels at the same positions on the substrate.

It could be understood from this graph that the organic EL device obtained by the method of the third embodiment had higher luminance at the same driving voltage.

As explained above, the method of the third embodiment can form the organic EL display having high uniformity among, and inside, the pixels and moreover having high luminance of each pixel.

Figure 11:
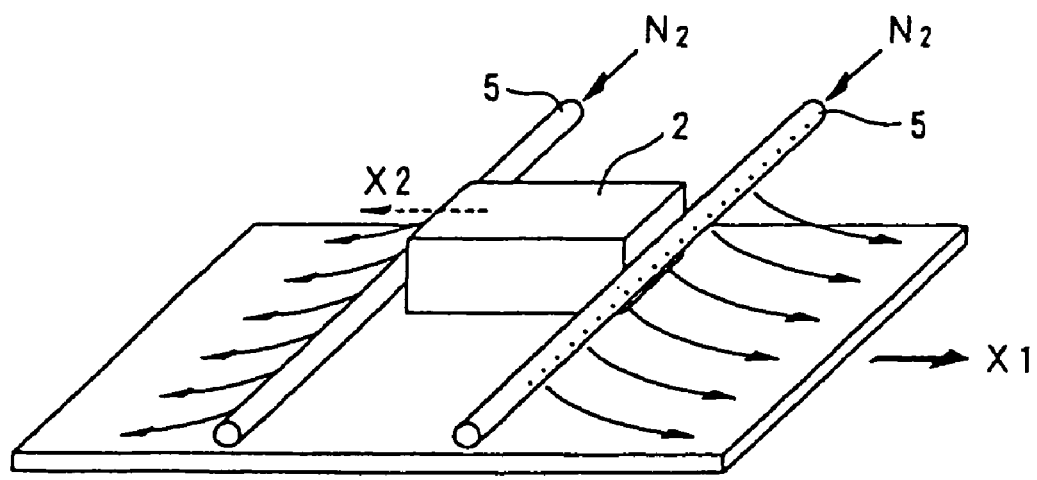
FIG. 11 is a perspective view showing another embodiment of the ink jet apparatus according to the present invention.

Incidentally, in the ink jet apparatus according to the second embodiment, the gas flow tube 5 is fixed on only the rear side of the relative traveling direction X2 of the ink jet head 2. However, the gas flow tubes 5 may well be disposed on both front and rear sides of the relative traveling direction X2 of the ink jet head 2 as shown in FIG. 11. This construction can remove the solvent vapor more strongly than when the gas flow tube 5 is disposed on only the rear side.

Figure 12:
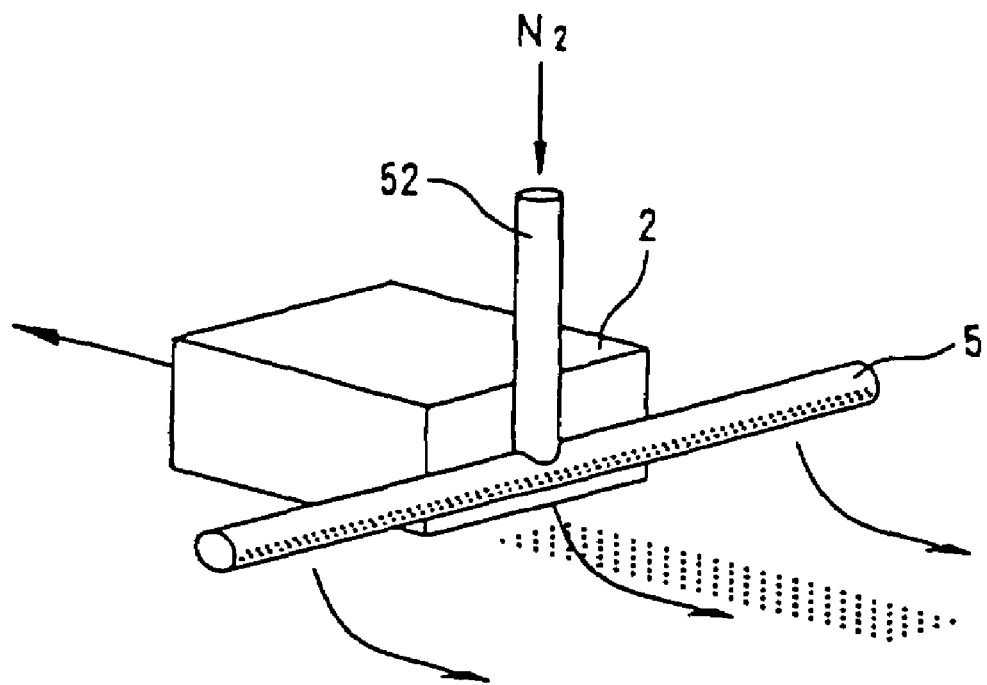
FIG. 12 is a perspective view showing still another embodiment of the ink jet apparatus according to the present invention.

In the ink jet apparatus according to the second embodiment, introduction of the gas to the gas flow tube 5 is made from the end part of the tube 5. As shown in FIG. 12, however, it is possible to connect a gas introduction tube 52 extending upward to the center of the gas flow tube 5 in its longitudinal direction, and to introduce the gas from this tube 52 into the tube 5. This construction can feed more easily the gas up to both ends of the tube 5 than when the gas is introduced from the end part of the tube 5.

Figure 13:
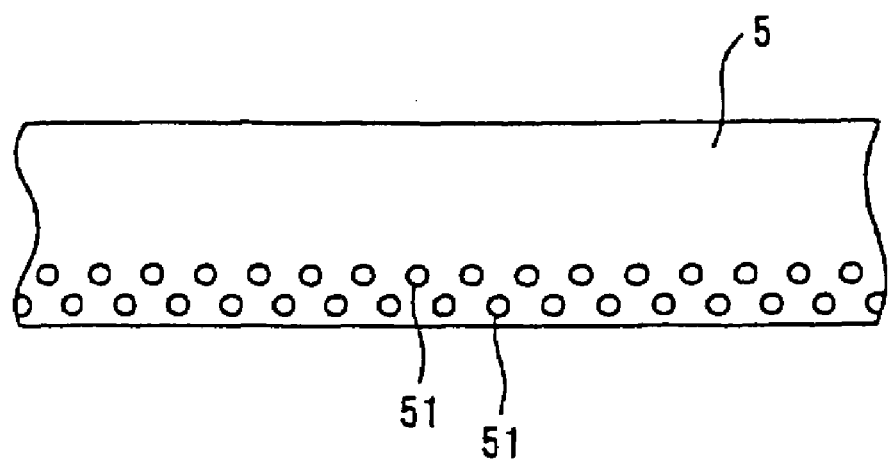
FIG. 13 is schematic view showing in enlargement a portion of gas blowout holes of a gas flow tube shown in FIG. 12.

FIG. 13 shows in enlargement the portion of the gas blowout holes 51 of the gas flow tube 5 shown in FIG. 12. As shown in this drawing, the gas blowout holes 51 may be disposed in two rows, or three or more rows. When the gas flow tube 5 has a plurality of rows of gas blowout holes 51, the blowout angle θ has a width when the tube 5 is fixed to the ink jet head 2. In consequence, the solvent vapor can be simultaneously removed in a broader range. In this case, the range of the gas blowout angle θ of a plurality of rows of gas blowout holes 51 is preferably from 30° to 60°.

The film formation by the ink jet method is conducted in some cases inside a sealed space such as a gloved box. When the removal of the solvent vapor is conducted by blowing the gas to the substrate surface inside the sealed space, the removing operation must be conducted while the blowout gas is being sucked. This suction must be conducted in such a fashion that the gas blown does not flow towards the ink jet head. Therefore, the suction port is disposed on the substrate side but not on the ink jet head side of the sealed space.

The method and the apparatus according to the present invention are suitable as a method of forming the thin film constituting the organic EL device and an apparatus for the method, as illustrated in the third embodiment, and are also suitable as a method and an apparatus for forming a thin film for constituting a color filter.

When the color filter thin film for use in a liquid crystal panel, etc, is formed by the ink jet method, a color filter forming material and a liquid containing a solvent are discharged from an ink jet head into a region encompassed by a bank on the substrate. In this instance, the solvent evaporating from the droplets arranged on the substrate are likely to dew on the bank. Here, since color filter thin films of different colors are generally formed in adjacent regions, dewing is likely to result in color mixing.

In this case, when the droplets are arranged by the method of the present invention, discharging of the liquid is conducted in the atmosphere having a low partial pressure of the solvent vapor even at a position having a late arrangement order, dewing described above can be prevented.

As described above, in the film formation method by the ink jet method, the method of the present invention can obtain a thin film having high uniformity inside the substrate surface even when the solvent of the liquid to be discharged is a solvent having a large density.

The ink jet apparatus according to the present invention can execute easily and effectively the method of the present invention.

The production method of the organic EL device according to the present invention can obtain an organic EL device having high uniformity of luminance inside the substrate surface.

The organic EL device according to the present invention has high uniformity of luminance inside the substrate surface.

What is claimed is:

1. A method of forming a thin film using an ink jet head, comprising:
   discharging liquid droplets containing a thin-film-forming material and a solvent from a liquid discharge port of the ink jet head to positions on a substrate while the liquid discharge port is being moved relatively to said substrate;
   forcibly removing a solvent vapor evaporating from a droplet arranged previously on the substrate by a solvent vapor removal device prior to completing droplet arrangement on the entire substrate, said solvent vapor removal device forcibly removing said solvent vapor by blowing gas on the substrate and simultaneously removing said solvent vapor through suction; and
   discharging liquid droplets in an atmosphere having a low partial pressure of the solvent vapor, the low partial pressure of the solvent vapor being low enough to allow a drying rate of later arranged liquid droplets to be about equal to or greater than a drying rate of earlier arranged liquid droplets.

2. The method of forming a thin film using an ink jet head according to claim 1, wherein during suction the gas flows away from the ink jet head.

3. The method of forming a thin film using an ink jet head according to claim 1, wherein the gas is blown at an angle of 30 to 60 degrees to a direction perpendicular to a movement direction of the ink jet head.

4. A method of producing an organic electroluminescence device, comprising:
   discharging liquid droplets containing the organic electroluminescence material and a solvent from a liquid discharge port of the ink jet head to positions on a substrate while the liquid discharge port is being moved relatively to said substrate;
   forcibly removing a solvent vapor evaporating from a droplet arranged previously on the substrate by a solvent vapor removal device prior to completing droplet arrangement on the entire substrate, said solvent vapor removal device forcibly removing said solvent vapor by blowing gas on the substrate and simultaneously removing said solvent vapor through suction; and
   discharging liquid droplets in an atmosphere having a low partial pressure of the solvent vapor, the low partial pressure of the solvent vapor being low enough to allow a drying rate of later arranged liquid droplets to be about equal to or greater than a drying rate of earlier arranged liquid droplets.

5. The method of producing an organic electroluminescence device according to claim 4, wherein during suction the gas flows away from the ink jet head.

6. The method of producing an organic electroluminescence device according to claim 4, wherein the gas is blown at an angle of 30 to 60 degrees to a direction perpendicular to a movement direction of the ink jet head.

7. A method of forming an organic electroluminescence device, comprising:
   forming a first electrode;
   discharging liquid droplets containing the organic electroluminescence material and a solvent for a color light emitting layer, above the first electrode, from a nozzle arranged at an ink jet head;
   forcibly removing a solvent vapor evaporating from a droplet arranged previously on the substrate by a solvent vapor removal device prior to completing droplet arrangement on the entire substrate, said solvent vapor removal device forcibly removing said solvent vapor by blowing gas on the substrate and simultaneously removing said solvent vapor through suction;

discharging liquid droplets in an atmosphere having a low partial pressure of the solvent vapor, the low partial pressure of the solvent vapor being low enough to allow a drying rate of later arranged liquid droplets to be about equal to or greater than a drying rate of earlier arranged liquid droplets; and forming a second electrode.

8. The method of forming an organic electroluminescence device according to claim 7, wherein during suction the gas flows away from the ink jet head.

9. The method of forming an organic electroluminescence device according to claim 7, wherein the gas is blown at an angle of 30 to 60 degrees to a direction perpendicular to a movement direction of the ink jet head.

10. A method of forming an organic electroluminescence device, comprising:

forming a first electrode;

forming a bank;

discharging liquid droplets containing the organic electroluminescence material and a solvent for a color light emitting layer, at a region encompassed by the bank, from a nozzle arranged at an ink jet head;

forcibly removing a solvent vapor evaporating from a droplet arranged previously on the substrate by a solvent vapor removal device prior to completing droplet arrangement on the entire substrate, said solvent vapor removal device forcibly removing said solvent vapor by blowing gas on the substrate and simultaneously removing said solvent vapor through suction;

discharging liquid droplets in an atmosphere having a low partial pressure of the solvent vapor, the low partial pressure of the solvent vapor being low enough to allow a drying rate of later arranged liquid droplets to be about equal to or greater than a drying rate of earlier arranged liquid droplets; and forming a second electrode.

11. The method of forming an organic electroluminescence device according to claim 10, wherein during suction the gas flows away from the ink jet head.

12. The method of forming an organic electroluminescence device according to claim 10, wherein the gas is blown at an angle of 30 to 60 degrees to a direction perpendicular to a movement direction of the ink jet head.

13. A method of forming an organic electroluminescence device, comprising:

forming a first electrode;

forming a bank;

discharging a first liquid droplets containing a hole injection-transportation layer material and a solvent-, at a region encompassed by the bank, from a nozzle arranged at an ink jet head;

forcibly removing a solvent vapor evaporating from a droplet of the first liquid droplets arranged previously on the substrate by a solvent vapor removal device prior to completing droplet arrangement on the entire substrate, said solvent vapor removal device forcibly removing said solvent vapor by blowing gas on the substrate and simultaneously removing said solvent vapor through suction;

discharging liquid droplets in an atmosphere having a low partial pressure of the solvent vapor, the low partial pressure of the solvent vapor being low enough to allow a drying rate of later arranged liquid droplets to be about equal to or greater than a drying rate of earlier arranged liquid droplets;

discharging a second liquid droplets containing the organic electroluminescence material and a solvent for a color light emitting layer, at a region encompassed by the bank, from a nozzle arranged at an ink jet head;

forcibly removing a solvent vapor evaporating from a droplet of the second liquid droplets arranged previously on the substrate by a solvent vapor removal device prior to completing droplet arrangement on the entire substrate;

discharging liquid droplets in an atmosphere having a low partial pressure of the solvent vapor, the low partial pressure of the solvent vapor being low enough to allow a drying rate of later arranged liquid droplets to be about equal to or greater than a drying rate of earlier arranged liquid droplets; and forming a second electrode.

14. The method of forming an organic electroluminescence device according to claim 13, wherein during suction the gas flows away from the ink jet head.

15. The method of forming an organic electroluminescence device according to claim 13, wherein the gas is blown at an angle of 30 to 60 degrees to a direction perpendicular to a movement direction of the ink jet head.

* * * * *